United States Patent
Cartier et al.

(10) Patent No.: US 6,639,154 B1
(45) Date of Patent: Oct. 28, 2003

(54) APPARATUS FOR FORMING A CONNECTION BETWEEN A CIRCUIT BOARD AND A CONNECTOR, HAVING A SIGNAL LAUNCH

(75) Inventors: Marc Cartier, Rochester, NH (US); Mark Gailus, Somerville, MA (US)

(73) Assignee: Teradyne, Inc., Boston, MA (US)

( * ) Notice: Subject to any disclaimer, the term of this patent is extended or adjusted under 35 U.S.C. 154(b) by 9 days.

(21) Appl. No.: 09/685,306

(22) Filed: Oct. 10, 2000

(51) Int. Cl.[7] ................................................ H05K 1/03
(52) U.S. Cl. .................. 174/255; 361/794; 361/780; 174/51; 174/262; 439/63; 324/158.1; 324/95
(58) Field of Search .................. 174/255, 262–266, 174/51; 361/780, 792–795; 439/63; 324/158.1, 95

(56) References Cited

U.S. PATENT DOCUMENTS

| | | | | |
|---|---|---|---|---|
| 4,645,288 A | * | 2/1987 | Stursa .......................... 439/581 |
| 4,861,944 A | * | 8/1989 | Jones et al. .................. 174/262 |
| 5,046,966 A | * | 9/1991 | Snyder et al. ............... 439/579 |
| 5,050,295 A | * | 9/1991 | Sullivan et al. ............. 174/266 |
| 5,174,768 A | * | 12/1992 | Hewison et al. ............. 174/51 |
| 5,326,937 A | * | 7/1994 | Watanabe ................... 174/262 |
| 5,363,280 A | * | 11/1994 | Chobot et al. .............. 174/266 |
| 5,373,231 A | * | 12/1994 | Boll et al. ................. 324/158.1 |
| 5,594,358 A | * | 1/1997 | Ishikawa et al. ............ 324/762 |
| 5,624,278 A | * | 4/1997 | Kuroda et al. .............. 439/675 |
| 5,683,255 A | * | 11/1997 | Menze ........................ 439/63 |
| 5,719,750 A | * | 2/1998 | Iwane ......................... 174/255 |
| 5,795,162 A | * | 8/1998 | Lambert ....................... 439/63 |
| 5,823,790 A | * | 10/1998 | Magnuson ................... 439/63 |
| 5,828,555 A | * | 10/1998 | Itoh ............................ 174/254 |
| 5,832,372 A | * | 11/1998 | Clelland et al. ............. 455/115 |
| 6,037,044 A | * | 3/2000 | Giri et al. ................... 174/255 |
| 6,194,669 B1 | * | 2/2001 | Bjorndahl et al. .......... 174/261 |
| 6,255,601 B1 | * | 7/2001 | Burkhart ..................... 174/255 |
| 6,281,690 B1 | * | 8/2001 | Frey ............................ 324/754 |
| 6,392,160 B1 | * | 5/2002 | Andry et al. ................ 174/261 |
| 6,407,652 B1 | * | 6/2002 | Kan ............................ 333/260 |
| 6,417,747 B1 | * | 7/2002 | Dearden et al. ............ 333/247 |

* cited by examiner

Primary Examiner—Kamand Cuneo
Assistant Examiner—Jose H. Alcala
(74) Attorney, Agent, or Firm—Chapin & Huang, L.L.C.; David E. Huang, Esq.

(57) ABSTRACT

A circuit board includes (i) a section of circuit board material having a signal conductor, a ground conductor, and dielectric material that separates the signal conductor and the ground conductor, and (ii) a signal launch. The signal launch includes a signal via that contacts the signal conductor and the dielectric material of the section of circuit board material, a first set of ground vias and a second set of ground vias. The ground vias contact the ground conductor and the dielectric material of the section of circuit board material. The first set of ground vias is disposed a first radial distance from the signal via. The second set of ground vias is disposed a second radial distance from the signal via. A coaxial connector mounts to the signal launch of the circuit board in order to provide electrical access to the signal and ground conductors.

22 Claims, 4 Drawing Sheets

APPARATUS FOR FORMING A CONNECTION BETWEEN A CIRCUIT BOARD AND A CONNECTOR, HAVING A SIGNAL LAUNCH

BACKGROUND OF THE INVENTION

A thorough test of a high-speed digital system typically includes a procedure for sampling signals from hardware components of the system (e.g., circuit boards, interconnects, silicon devices, etc.) to determine how these components affect signal integrity. To access these signals, an engineer or technician typically connects specialized measurement equipment to the system hardware. In some configurations, such equipment includes a measuring device (e.g., a Time Domain Reflectometer or TDR) that connects to a circuit board which is either (i) part of the high-speed digital system under test, or (ii) a specialized assembly (e.g., a daughter card) that closely integrates with the system under test (e.g., through high-density connectors). Typically, the engineer solders a coaxial radio frequency (RF) connector to a specialized feature of the circuit board called a signal launch. The engineer can then attach a coaxial cable (e.g., a 50 ohm cable) from the measuring device to the soldered RF connector in order to access signals of the system under test.

One type of signal launch, which is hereinafter referred to as an edge mount signal launch, resides along an edge of a special type of circuit board called a microstrip, or microstrip line, which has an exposed signal conductor on one side of a dielectric substrate and an exposed ground conductor on the other side. Both the signal and ground conductors typically run to the edge of the circuit board. An engineer typically attaches an edge mount coaxial RF connector having outer soldering posts and an inner soldering post to the circuit board. In particular, the engineer solders the inner soldering post of the connector to the signal conductor and the outer soldering posts to the ground conductor. The engineer can then access signals of the system under test by attaching a coaxial cable from a measuring device to the connector.

Another type of signal launch, which is hereinafter referred to as a surface mount signal launch, resides on the surface of a circuit board rather that along an edge in order to receive a connector that mounts perpendicularly relative to the circuit board surface. A circuit board having multiple surface mount signal launches may position these signal launches in a circular fashion around a component mounting location (e.g., an array of vias for a high-density connector) such that etch lengths from the mounting location to the signal launches are of equal lengths for signal matching purposes. A conventional surface mount signal launch typically includes a large centrally-located signal via (i.e., a plated-through hole) and four large ground vias that are equidistant from the signal via. An engineer typically places a surface mount coaxial RF connector having a thick centrally located signal post and four thick surrounding ground posts over the surface mount signal launch such that each post inserts into a respective via (the signal post in to the signal via and the ground posts into the ground vias). The engineer then solders the posts to the surface mount signal launch. The engineer can then attach a coaxial cable from the connector to the measuring device in order to access signals of the system under test using the measuring device.

SUMMARY OF THE INVENTION

Unfortunately, there are deficiencies to the above-described conventional types of signal launches. For example, in connection with the conventional edge mount signal launches, it is difficult to position multiple edge mount signal launches in a circular fashion around a component mounting location (e.g., an array of vias for a high-density connector) such that etch lengths from the mounting location to the signal launches are equal for signal matching purposes. Circuit boards are typically rectangular in shape (i.e., have straight edges rather than circular edges) thus making it difficult to position edge mount signal launches in a circular manner. Additionally, a typical circuit board has a relatively small amount of perimeter length (vis-à-vis surface area) thus limiting the number of edge mount signal launches that can be conveniently placed on that circuit board when compared to the number of surface mount signal launches that can be placed on a circuit board. Furthermore, edge mount signal launch connections are highly susceptible to damage and fatigue over time due to there location along the circuit board edge. For example, a relatively a small amount of torque on an edge mount connector can stress the connector, solder joints and circuit board in that area to a point that causes a fracture in the solder joint or perhaps physical damage to the connector and/or the circuit board.

In connection with conventional surface mount signal launches, such launches are typically not well impedance-matched with their coaxial surface mount RF connector counterparts, and are thus a source of signal distortion. In particular, the centrally-located signal via and surrounding ground vias are typically made large for improved manufacturability (simpler drilling and plating) and soldering (more room to accommodate the thick connector posts and promote solder flow during the soldering process). Unfortunately, the large size of the centrally-located signal via reduces the amount of clearance between the signal via and surrounding ground conductor within the circuit board (i.e., ground planes) thus providing a high capacitance effect between the signal via and the ground conductor. Additionally, the large size of the signal via forces the ground vias to be placed substantially away from the center of the signal launch, the distance being uncharacteristically greater than the distance between the inner conductor and the outer conductor of standard coaxial cable (e.g., 50 ohm cable) thus creating inductance loops within the surface mount signal launches. The high capacitance effect and created inductance loops tend to distort signals through the surface mount signal launches thus degrading signal integrity.

Unfortunately, for the conventional surface mount signal launch, it would be difficult to counteract the above-described transmission line effects by changing the size of the signal via or positions of the ground vias. In particular, it would be difficult to decrease the size of the signal via because the conventional surface mount signal launch must accommodate soldering of a thick signal post of the coaxial RF connector. Furthermore, it would be difficult to move the ground vias closer to the signal via since the conventional surface mount signal launch solders to the RF connector, and an adequate amount of clearance is required between the ground vias and the signal via to prevent mechanical mounting problems and soldering problems.

In contrast to the above-described conventional signal launches, the invention is directed to techniques for forming a connection between a circuit board and a connector using a signal launch having multiple sets of ground vias. One set of ground vias enables the connector to mount securely to the circuit board (e.g., using solder, screws and nuts, etc.), while another set of ground vias provides electrical pathways that more closely match conductor clearances of a coaxial cable which can connect the connector to a measuring device (e.g., a TDR). Such pathways decrease signal distortion through the signal launch and the connector (e.g., keep any inductance loops small) thus improving the accuracy of signal measurements from the circuit board.

One arrangement of the invention is directed to a connection system having a circuit board that includes (i) a section of circuit board material having a signal conductor, a ground conductor, and dielectric material that physically separates the signal conductor and the ground conductor, and (ii) a signal launch. The signal launch includes a signal via that physically contacts the signal conductor and the dielectric material of the section of circuit board material. The signal launch further includes a first set of ground vias and a second set of ground vias, each of which physically contacts the ground conductor and the dielectric material. Each of the first set of ground vias is disposed a first radial distance from the signal via (e.g., 0.100 of an inch or 100 "mils" from the center of the signal via). Each of the second set of ground vias is disposed a second radial distance from the signal via (e.g., more than 140 mils from the center of the signal via). The connection system further includes a coaxial connector that mounts to the signal launch of the circuit board in order to provide electrical access to the signal and ground conductors of the circuit board. The different sets of ground vias provides flexibility enabling one set to operate as a mounting holes (e.g., for soldering or bolting the connector to the signal launch), and the other set to provide improved transmission line characteristics (smaller inductance loops, etc.) in order to reduce signal distortion.

In one arrangement, the signal launch further includes a ground pad disposed on a surface of the section of circuit board material. The ground pad physically contacts each of the first and second sets of ground vias of the signal launch and the dielectric material of the section of circuit board material. The ground pad enables improved electrical contact between the connector and the signal launch by providing additional surface area that contacts the connector. In particular, portions of the ground pad that are close the signal via can contact conductive portions of the connector that are close to the signal conductor of the connector in order to minimize inductance loops. Additionally, the ground pad ties each of the ground vias together for improved signal distribution.

In one arrangement, the signal launch includes a ground pad on both sides of the circuit board. This arrangement provides symmetry to accommodate the standard practice of many circuit board manufacturers of making each side of the circuit board symmetrical.

In one arrangement, the first radial distance is smaller than the second radial distance such that the first set of ground vias is disposed closer to the signal via than the second set of ground vias. Furthermore, the signal via has an inner diameter (e.g., 15 mils) that is smaller than an inner diameter of each of the first set of ground vias (e.g., 22 mils). In this arrangement, the signal via has a narrow inner diameter that is convenient for receiving a pin but allows the first set of the ground vias (i.e., the closest set) to have a somewhat larger inner diameter for improved manufacturability (e.g., simpler drilling and plating) and signal integrity purposes. The smaller size of the signal via allows for a larger clearance or void between the signal via and ground planes within the circuit board (i.e., a larger anti-pad) over that of conventional surface mount signal launches thus improving the transmission line characteristics (e.g., the capacitance effect) of this arrangement for less signal distortion.

In one arrangement, the first radial distance is smaller than the second radial distance such that the first set of ground vias is disposed closer to the signal via than the second set of ground vias. Additionally, the signal via has an inner diameter (e.g., 15 mils) that is smaller than an inner diameter of each of the second set of ground vias (e.g., 67 mils). In this arrangement, the signal via has a narrow inner diameter that is convenient for receiving a pin but allows the second set of ground vias (the ground vias farthest from the signal via) to have a large inner diameter that enables mounting of the connector to the circuit board (e.g., bolting, soldering, etc.).

In one arrangement, the first radial distance is smaller than the second radial distance such that the first set of ground vias is disposed closer to the signal via than the second set of ground vias. Furthermore, each of the first set of ground vias has an inner diameter (e.g., 22 mils) that is smaller than an inner diameter of each of the second set of ground vias (e.g., 67 mils). In this arrangement, each of the first set of ground vias has a smaller inner diameter enabling it to be positioned closer to the signal via for improved signal integrity purposes, i.e., to better imitate the conductor clearance of a coaxial cable yet still maintain a large anti-pad. In one arrangement, the dielectric material of the section of circuit board material separates the first set of ground vias from the signal via by less than 82 mils. In this arrangement, each of the second set of ground vias (the outer set) has a larger inner diameter enabling it to fasten the connector to the circuit board (e.g., by soldering, bolting, etc.).

In one arrangement, the signal launch further includes a signal pin that electrically connects with the signal conductor of the section of circuit board material through the signal via. In particular, the signal pin extends perpendicularly from a plane of the section of circuit board material. This arrangement enables a female section of a connector to at least temporarily mount (e.g., engage) with the signal launch thus providing the option of removing the connector at a later time (e.g., to replace the connector, to reuse the connector on a new signal launch, etc.). Furthermore, the pin preferably has a narrow diameter (e.g., 11 mils) to reduce the capacitance effect between signal and ground conductors.

In one arrangement, the signal pin has a diameter (e.g., 11 mils) that is less than an inner diameter of the signal via (e.g., 15 mils), and the signal pin connects to the signal via through a solder joint. In this arrangement, the solder joint provides a reliable and robust electrical connection between the pin and the signal via.

In an alternative arrangement, at least a portion of the signal pin has a diameter (e.g., 15 mils) that is greater than or equal to an inner diameter of the signal via (e.g., 15 mils), and the signal pin connects to the signal via in a press-fit manner. In this arrangement, the pin is removable from the signal via thus improving the flexibility of the connection system (e.g., removing the pin in order to later mount a male connector over the signal launch).

In one arrangement, each of the first set of ground vias is disposed between the signal via and a respective one of the second set of ground vias. The placement of the first set of ground vias in line with the second set of ground vias thus can assist in minimizing, counteracting, or shielding the signal via from, any negative inductance loop affects provided by the second set of ground vias. Additionally, the placement of the first set of ground vias in line with the second set of ground vias enables a signal conductor to easily lead to the signal via within the circuit board without having to wind around any ground vias.

The features of the invention, as described above, may be employed in testing systems, devices and methods and other computer-related assemblies such as those of Teradyne Corporation of Boston, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for forming a connection between a circuit board and a connector using a signal launch having multiple sets of ground vias. One set of ground vias enables the connector to mount securely to the circuit board in a traditional manner (e.g., using screws and nuts), while another set of ground vias provides electrical pathways having conductor clearances that more closely match that of a coaxial cable which can then electrically connect the circuit board to a measuring device (e.g., a TDR) through the connector. Such pathways decrease signal distortion through the connector (e.g., by reducing inductance loops) thus improving the accuracy of signal measurements from the circuit board. The techniques of the invention may be used for testing high-speed digital system, and in other computer-related systems and methods, such as those of Teradyne Corporation of Boston, Mass.

Figure 1:
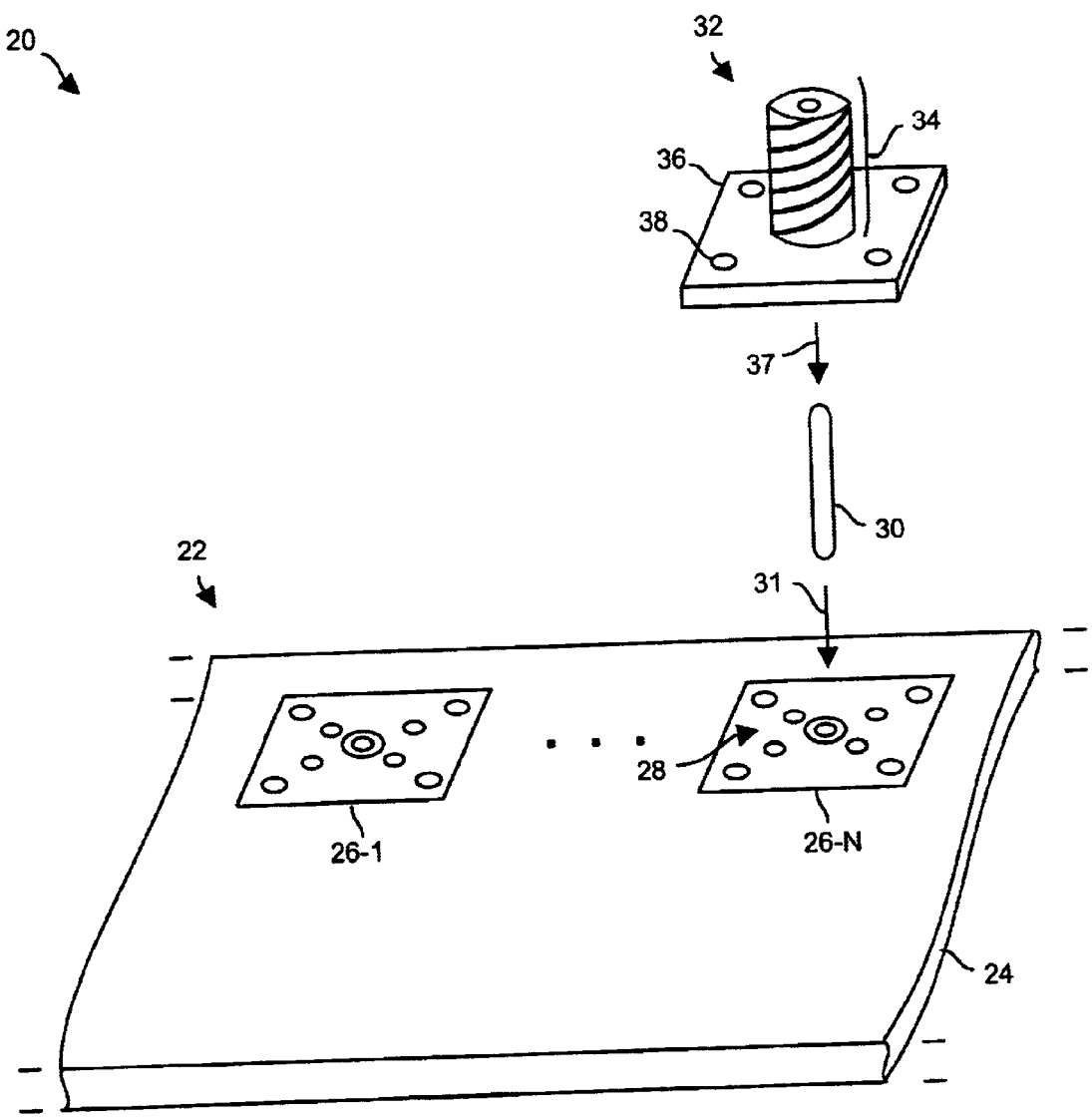
FIG. 1 is a perspective view of a connection system which is suitable for use by the invention.

FIG. 1 shows a connection system 20 which is suitable for use by the invention. The connection system 20 includes a circuit board 22 having, among other things, a section of the circuit board 24 upon which reside signal launches 26-1, . . . , 26-N (collectively signal launches 26). Each signal launch 26 includes multiple vias 28 (plated-through holes), and a pin 30 that inserts into a particular one of the vias 28 when moved in a direction 31 that is perpendicular to the plane of the circuit board 22. In one arrangement, the pin 30 solders to that via 28. In another arrangement, the pin 30 installs within that via 28 in a press-fit manner and is more easily removable.

As will be shown and described in further detail shortly, the section of circuit board material 24 includes conductive material (e.g., copper etch) and dielectric material (e.g., Fiberglass, plastic or other non-conductive substance). The conductive material includes a signal conductor that electrically connects to the via 28 (a signal via) that receives the pin 30. The conductive material further includes a ground conductor (e.g., one or more ground planes) that electrically connects to other vias 28 (ground vias) surrounding the via 28 receiving the pin 30.

The connection system 20 of FIG. 1 further includes a flat-faced coaxial RF connector 32 having a cable mating portion 34 and a flange portion 36. When the connector 32 properly aligns with a signal launch 26 and moves in a direction 37 toward that signal launch, a lower female section of the cable mating portion 34 engages the pin 30 of that signal launch 26, and the flange portion 36 contacts an outer surface of the signal launch. It should be understood that during such alignment, the connector 32 moves in a direction that is substantially perpendicular with the plane of the circuit board section 24.

The flange portion 36 defines holes 38 that align with particular vias 28 of the signal launch 26 to enable fastening of the connector 32 to the signal launch 26 (e.g., to enable screws or soldering posts to pass through those vias 28 and secure the connector 32 to the circuit board section 24). Preferably, the flange portion 36 is a solid metallic structure that provides (i) a reliable means for fastening the connector 32 to the circuit board section 24 (e.g., using screws) as well as (ii) an electrical pathway to the ground conductor of the circuit board through certain vias 28.

In one arrangement, the connector 32 is a standard off-the-shelf coaxial surface mount RF connector. An example of such a component is Precision Microwave Component No.: 5941-4CC manufactured by Connecting Devices, Incorporated (CDI) of Long Beach, Calif., which is also suitable for connecting to conventional surface mount SMA launches. Further details of the connecting system 20 will now be provided with reference to FIGS. 2 and 3.

Figure 2:
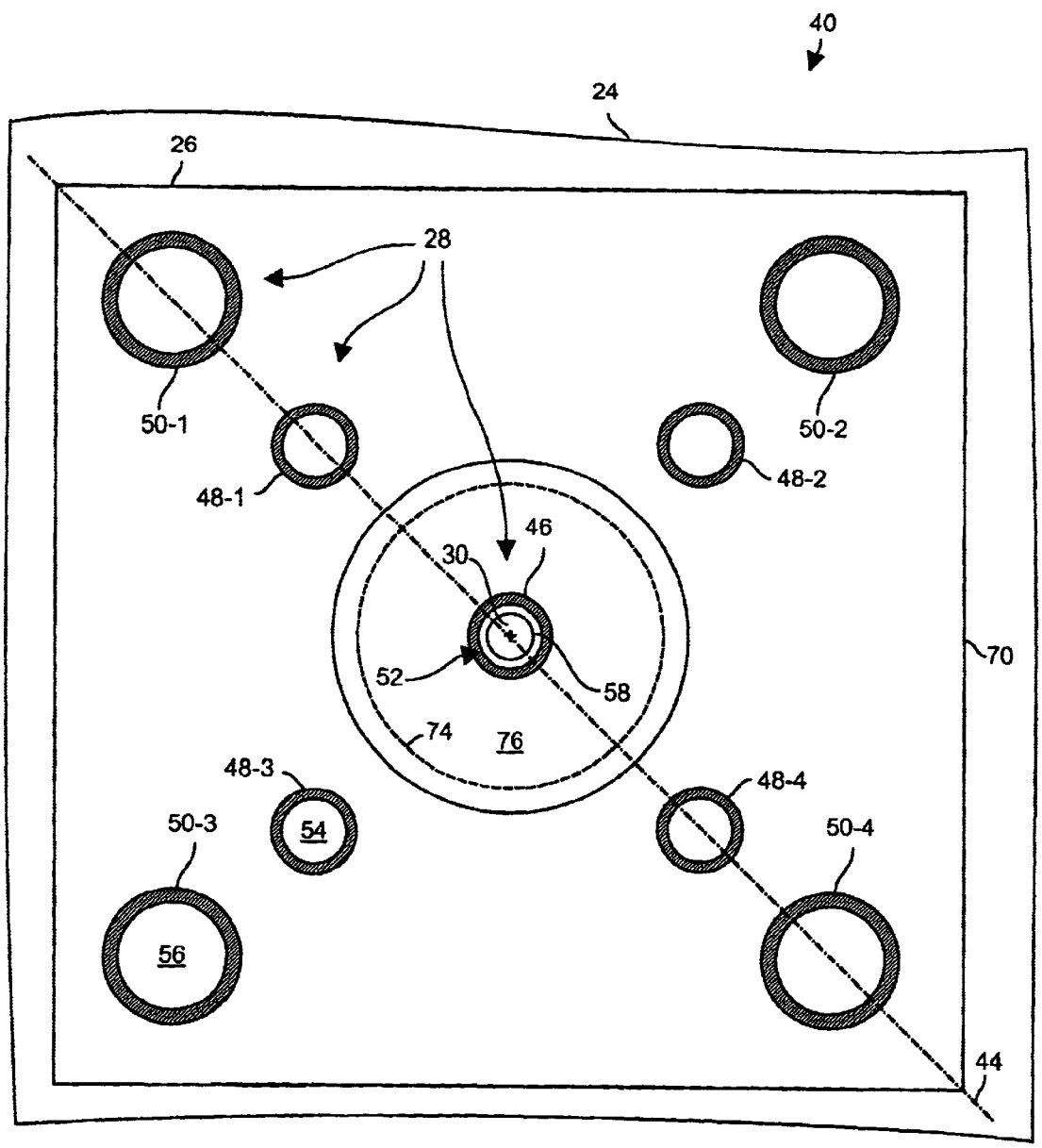
FIG. 2 is a top view of a signal launch of a circuit board of the connection system of FIG. 1.
Figure 3:
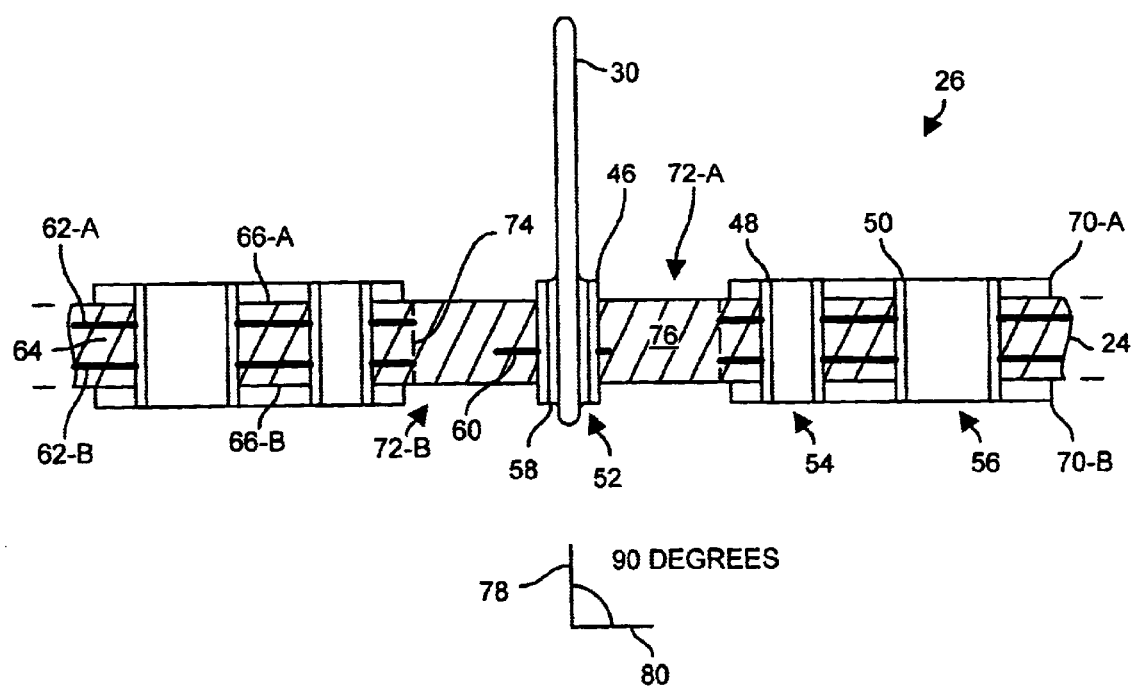
FIG. 3 is a cross-sectional view of the circuit board of FIG. 2.

FIGS. 2 and 3 respectively show a top view 40 and a cross-sectional view 42 of a signal launch 26 of the circuit board section 24 of FIG. 1. The cross-sectional view 42 of FIG. 3 illustrates a cross-section of the circuit board section 24 along a diagonal line 44 of the signal launch 26 of FIG. 2.

The signal launch 26 includes, as the vias 28 of FIG. 1, a signal via 46, a first set of ground vias 48-1, . . . , 48-4 (collectively ground vias 48) and a second set of ground vias 50-1, . . . , 50-4 (collectively ground vias 50). The signal via 46 preferably has an inner diameter 52 (i.e., the diameter of the via cavity) that is smaller than an inner diameter 54 of the ground vias 48, and smaller than an inner diameter 56 of the ground vias 50 (see FIG. 2). In one arrangement, the inner diameter 52 of the signal via 46 is substantially 15 mils, the inner diameters 54 of the ground vias 48 are substantially 22 mils, and the inner diameters 56 of the ground vias 50 are substantially 67 mils. The small inner diameter 52 of the signal via 46 makes the signal via 46 suitable for supporting the pin 30. As shown in FIGS. 2 and 3, and by way of example only, at least a portion of the pin 30 has a diameter (e.g., 11 mils) that is less than the internal diameter 52 of the signal via 46 and connects to the signal via 46 by way of a solder joint 58.

It should be further understood that the inner diameters 56 of the ground vias 50 are larger than the inner diameters 54 of the ground vias 48 to enable the cavities of the ground vias 50 to enable fastening of the connector 32 to the circuit board section 24 (e.g., to enable screws or soldering posts of the connector 32 to pass therethrough). The connector 32 and the signal launch 26 can thus form a structurally sound and electrical reliable connection. Such a connection is superior to connections formed by conventional edge mount signal launch connections which are prone to damage and fatigue (e.g., due torque placed on the edge mount connector). Additionally, the presence of the ground vias 48 provides transmission line characteristics that are superior to conventional surface mount signal launch connections since the inner diameters 54 of the ground vias 48 can be kept small in order to position the ground vias 48 closer to the signal via 46 to mimic (or match) the conductor clearances of a typical coaxial cable (e.g., 50 ohm cable) and thus minimize signal distortion (i.e., to reduce inductance loops), and to leave wide paths for the signal conductor to lead to and connect with the signal via 46 within the circuit board 22. Further details of the circuit board section 24 will now be provided with reference to FIG. 3.

As shown in FIG. 3, the signal via 46 connects to a signal conductor 60 within the circuit board section 24. Similarly, each of the ground vias 48, 50 connects to ground conductors 62-A, 62-B (i.e., ground planes). Dielectric material 64 (e.g., non-conductive Fiberglass) of the circuit board section 24 separates the signal conductor 60 from the ground conductors 62, and provides a top surface 66-A and a bottom surface 66-B upon which other circuit board features reside. In one arrangement, the signal conductor 60 resides at least half way toward the bottom surface 66-B (e.g., three quarters of the way toward the bottom surface 66-B) in order to reduce the amount of stub for signal integrity purposes. That is, in this arrangement, the signal conductor 60 connects with the signal via 46 at a point along the signal via 46 that is closer to the bottom surface 66-B than the top surface 66-A.

The signal launch 26 further includes ground pads 70-A, 70-B (collectively ground pads 70) that respectively reside on the surfaces 66-A, 66-B of the circuit board section 24 and around the signal via 46. As shown in FIG. 3, a gap region 72-A separates the ground pad 70-A from the signal via 46. Similarly, a gap region 72-B separates the ground pad 70-B from the signal via 46 (see FIG. 3). The inner edge of the gap regions 72 can align with an inner edge 74 of the ground conductors 62. Preferably, the inner edge of the gap region 72-A is at least as large (i.e., wide) as the inner diameter of the ground conductor of the flat-faced side of the flange portion 36 of the connector 32.

Again, it should be understood that each ground pad 70 increases the amount of conductive surface area over that provided by conventional signal launches that consist of only vias. In particular, portions of the ground pads 70 that are close to the signal via 46 can contact conductive portions of the connector 32 that are close to the signal conductor of the connector 32 in order to minimize inductance loops. Furthermore, the ground pads 70 tie each of the ground vias 48, 50 together for improved signal return current distribution. As a result, the signal launches 26 form superior electrical contact with connectors (e.g., the connector 32 of FIG. 1).

As shown FIG. 3, the ground conductors 62 do not significantly extend into the gap regions 72-A, 72-B. Rather, the ground conductors 62 terminate at the edge 74 which defines a ground plane void, which is hereinafter referred to as an anti-pad 76. That is, there is no ground conductor 62 within the anti-pad 76. The anti-pad 76 extends to the gaps 72-A and 72-B on the surfaces of the circuit board section 24.

In one arrangement, the anti-pad 76 is larger (e.g., a diameter of 100 mils) than that of conventional surface mount signal launches due to a small signal via (e.g., 15 mils in internal diameter) to provide a reduced capacitance effect. The use of the soldered pin 30 allows the signal via 46 to take such a small size since there is no need for a larger signal via for soldering of a thick connector post as in conventional surface mount signal launch configurations. Furthermore, the narrow diameter of the pin 30 (e.g., 11 mils) further reduces the capacitance effect. The above-described reduced capacitance effect provides less signal distortion than the smaller anti-pads of conventional surface mount signal launches.

It should be understood that the axis 78 of the pin 30 extends in a perpendicular direction (substantially 90 degrees) from the plane 80 of the circuit board section 24. Accordingly, the connector 32 is capable of engaging the pin 30 and mounting to the signal launch 26 when moved along the direction 37 of the pin 30 until the flange portion 36 is flush with the signal launch 26 (also see FIG. 1). Details of a procedure of the invention will now be provided with reference to FIG. 4.

Figure 4:
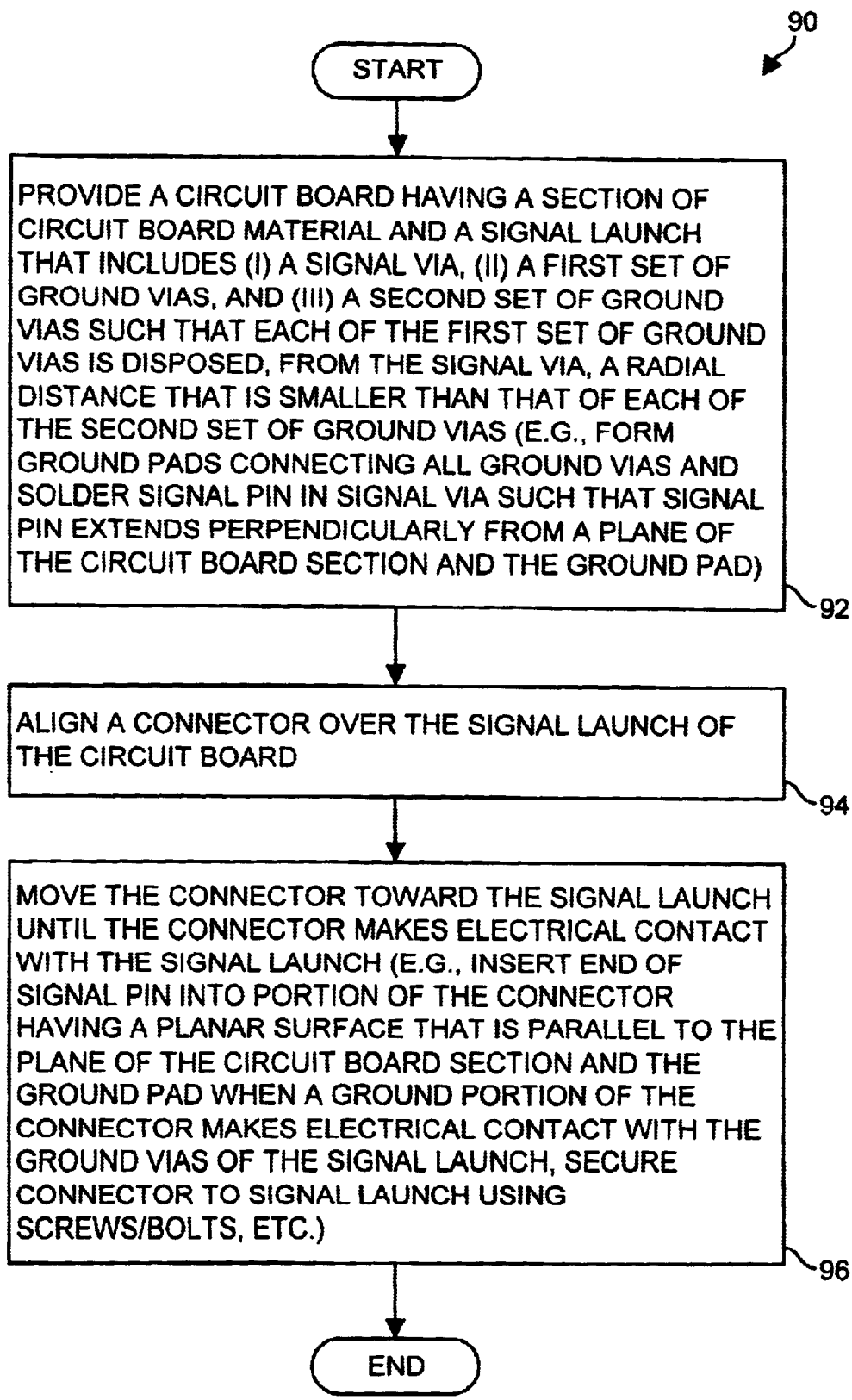
FIG. 4 is a procedure for forming a connection system in accordance with an embodiment of the invention.

FIG. 4 shows a procedure 90 which is performed, e.g., by a circuit board tester or manufacturer, when forming a connection between a circuit board and a connector in accordance with the invention. In step 92, the circuit board tester provides a circuit board having a section of circuit board material and a signal launch including (i) a signal via, (ii) a first set of ground vias, and (iii) a second set of ground vias such that each of the first set of ground vias is disposed, from the signal via, a radial distance (e.g., 100 mils) that is smaller than that of each of the second set of ground vias (e.g., greater than 140 mils). That is, the tester provides the circuit board such that the ground vias of the first set are closer to the signal via than the ground vias of the second set.

In step 94, the circuit board tester aligns a connector over the signal launch of the circuit board. Preferably, the connector is a coaxial RF connector that is well matched to a coaxial cable (e.g., 50 ohm cable) which is capable of electrically connecting the connector to a measuring device (e.g., a TDR).

In step 96, the circuit board tester moves the connector toward the signal launch until the connector makes electrical contact with the signal launch. Preferably, the tester fastens the connector to the signal launch of the circuit board in a secure manner (e.g., using screws and nuts).

At the completion of step 96, the circuit board tester has formed a connection between the circuit board and the connector. The tester can then connect a cable between the measuring device and the connector in order to access signals with the circuit board.

Further details of the procedure 90 will now be provided by way of the following example which refers to the connection system 20 of FIGS. 1 through 3. Suppose that a circuit board manufacturer wishes to examine particular electrical properties of a device under test (DUT) using the circuit board 22 of FIG. 1 by performing the procedure 90 of FIG. 4. The circuit board 22 can be the DUT itself, or an ancillary circuit board (e.g., a daughter card) that closely integrates with the DUT (e.g., couples through a high-density connector, a backplane, etc.).

As step 92 of the procedure 90, the manufacturer provides a circuit board having one or more signal launches 26. Each signal launch 26 includes a signal via 46, a first set of ground vias 48 and a second set of ground vias 50. As shown in FIG. 2, the first set of ground vias 48 are closer to the signal via 46 than the second set of ground vias 50. Additionally, the manufacturer fastens a pin 30 to the signal via 46 of each signal launch 26 (e.g., using solder such that the pin 30 extends perpendicularly from a plane of the circuit board 22. As a result, the circuit board 22 is now ready to connect with the connector 32.

As step 94 of the procedure 90, the manufacturer aligns the connector 32 over the signal launch 26 of the circuit board 22. In particular, the manufacturer positions the lower female section of the cable mating portion 34 of the connector 32 such that it will engage the pin 30 when moved toward the circuit board 22 (see arrow 37 in FIG. 1).

As step 96, the manufacturer moves the connector 32 toward the signal launch 26 until the connector 32 makes contact with the signal launch 26. In particular, the manufacturer inserts the extending end of the pin 30 into the lower female section of the cable mating portion 34 of the connector 32. The planar surface of the flange portion 36 then makes electrical contact with the ground vias 48, 50 of the signal launch 26. The manufacturer then secures the connector 32 to the signal launch 26 using a fastener (e.g., solder, screw and nuts, etc.). As a result, a robust and well-matched connection is formed between the circuit board 22 and the connector 32 allowing access to DUT signals.

As described above, the invention is directed to techniques for forming a connection between a circuit board and a connector using a signal launch having multiple sets of ground vias. One set of ground vias enables the connector to mount securely to the circuit board in a standard manner (e.g., using screws and nuts), while another set of ground vias provides conduction paths that more closely match that of a coaxial cable (e.g., 50 ohm cable) which can then electrically connect the circuit board to a measuring device (e.g., a TDR) through the connector. Such paths decrease the inductance loops formed by the signal launch, and thus decrease signal distortion through the signal launch and the connector thus improving the accuracy of signal measurements from the circuit board. The techniques of the invention may be used for sampling signals in a high-speed digital system, a high-frequency RF or microwave system, or in other computer-related systems and methods, such as those of Teradyne Corporation of Boston, Mass.

While this invention has been particularly shown and described with references to preferred embodiments thereof, it will be understood by those skilled in the art that various changes in form and details may be made therein without departing from the spirit and scope of the invention as defined by the appended claims.

For example, the pin 30 was described above as (i) having a diameter that is less than that of the signal via 46 of the signal launch 26, and (ii) soldering to the signal via 46 when secured to the circuit board 22. It should be understood that other connection techniques are suitable for use by the invention as well. For instance, in an alternative arrangement, at least a portion of the pin 30 has a diameter that is equal to or slightly larger than the inner diameter of the signal via 46 of the signal launch 26, and the pin 30 fastens to the signal via 46 in a press-fit manner. In yet another alternative arrangement, the signal launch 26 does not include a pin 30. Rather, the connector 32 has a male portion that inserts within the signal via 46 (e.g., solders or press-fits to the signal via 46).

Additionally, it should be understood that the ground vias 48, 50 were described above, by way of example only, as aligning such that (i) the inner ground vias 48 essentially electrically shielded the outer ground vias 50, and (ii) the signal conductor had an easy path to the signal via without having to wind around the ground vias 48, 50. In an alternative arrangement, the inner ground vias 48 do not align with the outer ground vias 50. This alternative arrangement makes the geometries and number of the inner vias 48 less dependent on the geometries and number of the outer vias 50 thus allowing the inner vias 48 to be sized larger or smaller without interfering with the outer vias 50.

Furthermore, it should be understood that the circuit board 22 was described as having ground pads 70 for a signal launch 26 on both sides of the circuit board 22 by way of example only. In another arrangement, the circuit board 22 has a ground pad 70 only on one side (e.g., ground pad 70-A). Such modifications are intended to be within the spirit and scope of the invention.

What is claimed is:

1. A circuit board, comprising:
   a circuit board portion having a top surface, a bottom surface, a signal layer, a ground layer, and dielectric material that physically separates the signal layer and the ground layer; and
   a signal launch having:
      a signal via that physically contacts a signal conductor of the signal layer and the dielectric material of the circuit board portion, the signal via extending entirely through the circuit board portion from the top surface of the circuit board portion to the bottom surface of the circuit board portion, and
      a first set of ground vias and a second set of ground vias that physically contact a ground conductor of the ground layer and the dielectric material of the circuit board portion, wherein each of the first set of ground vias is disposed a first radial distance from the signal via, wherein each of the second set of ground vias is disposed a second radial distance from the signal via, and wherein the first and second radial distances are different.

2. The circuit board of claim 1 wherein the signal launch further includes:
   a ground pad, disposed on the top surface of the circuit board portion, the ground pad physically contacting each of the first and second sets of ground vias of the signal launch and the dielectric material of the circuit board portion.

3. The circuit board of claim 1 wherein the signal launch further includes:
   a first ground pad, disposed on the top surface of the circuit board portion, the first ground pad physically contacting each of the first and second sets of ground vias of the signal launch and the dielectric material of the circuit board portion; and
   a second ground pad, disposed on the bottom surface of the circuit board portion, the bottom surface of the circuit board portion being substantially coplanar with the top surface of the circuit board portion, the second ground pad physically contacting each of the first and second sets of ground vias of the signal launch and the dielectric material of the circuit board portion.

4. The circuit board of claim 1 wherein the first radial distance is smaller than the second radial distance such that the first set of ground vias is disposed closer to the signal via than the second set of ground vias, and wherein the signal via has an inner diameter that is smaller than an inner diameter of each of the first set of ground vias.

5. The circuit board of claim 1 wherein the first radial distance is smaller than the second radial distance such that the first set of ground vias is disposed closer to the signal via than the second set of ground vias, and wherein the signal via has an inner diameter that is smaller than an inner diameter of each of the second set of ground vias.

6. The circuit board of claim 1 wherein the first radial distance is smaller than the second radial distance such that the first set of ground vias is disposed closer to the signal via than the second set of ground vias, and wherein each of the first set of ground vias has an inner diameter that is smaller than an inner diameter of each of the second set of ground vias.

7. The circuit board of claim 1 wherein the signal launch further includes:

a signal pin that electrically connects with and physically couples with the signal conductor of the circuit board portion through the signal via, the signal pin extending perpendicularly from a plane of the circuit board portion.

8. The circuit board of claim 7 wherein the signal pin has a diameter that is less than an inner diameter of the signal via, and wherein the signal pin connects to the signal via through a solder joint.

9. The circuit board of claim 7 wherein at least a portion of the signal pin has a diameter that is greater than an inner diameter of the signal via, and wherein the signal pin connects to the signal via in a press-fit manner.

10. The circuit board of claim 1 wherein the dielectric material of the circuit board portion separates the first set of ground vias from the signal via by less than 0.082 of an inch.

11. The circuit board of claim 1 wherein each of the first set of ground vias is disposed between the signal via and a respective one of the second set of ground vias.

12. The circuit board of claim 1 wherein the signal conductor of the circuit board portion connects with the signal via of the signal launch at a point along the signal via that is closer to the top surface than the bottom surface.

13. A connection system, comprising:

a circuit board that includes (i) a circuit board portion having a top surface, a bottom surface, a signal layer, a ground layer, and dielectric material that physically separates the signal layer and the ground layer, and (ii) a signal launch having:

a signal via that physically contacts a signal conductor of the signal layer and the dielectric material of the circuit board portion, the signal via extending entirely through the circuit board portion from the top surface of the circuit board portion to the bottom surface of the circuit board portion, and a first set of ground vias and a second set of ground vias that physically contact a ground conductor of the ground layer and the dielectric material of the circuit board portion, wherein each of the first set of ground vias is disposed a first radial distance from the signal via, wherein each of the second set of ground vias is disposed a second radial distance from the signal via, and wherein the first and second radial distances are different; and a coaxial connector that mounts to the signal launch of the circuit board in order to provide electrical access to the signal and ground conductors of the circuit board portion.

14. The connection system of claim 13 wherein the signal launch of the circuit board further includes:

a ground pad, disposed on the top surface of the circuit board portion, the ground pad physically contacting each of the first and second sets of ground vias of the signal launch and the dielectric material of the circuit board portion.

15. The connection system of claim 13 wherein the first radial distance is smaller than the second radial distance such that the first set of ground vias is disposed closer to the signal via than the second set of ground vias, and wherein the signal via has an inner diameter that is smaller than an inner diameter of each of the first set of ground vias.

16. The connection system of claim 13 wherein the first radial distance is smaller than the second radial distance such that the first set of ground vias is disposed closer to the signal via than the second set of ground vias, and wherein the signal via has an inner diameter that is smaller than an inner diameter of each of the second set of ground vias.

17. The connection system of claim 13 wherein the first radial distance is smaller than the second radial distance such that the first set of ground vias is disposed closer to the signal via than the second set of ground vias, and wherein each of the first set of ground vias has an inner diameter that is smaller than an inner diameter of each of the second set of ground vias.

18. The connection system of claim 13 wherein the signal launch further includes:

a signal pin that electrically connects with the signal conductor of the signal layer through the signal via, the signal pin extending perpendicularly from a plane of the circuit board portion.

19. The circuit board of claim 1 wherein the first set of ground vias includes multiple first ground vias which are substantially evenly distributed in a radial manner around the signal via, and wherein the second set of ground vias includes multiple second ground vias which are substantially evenly distributed in a radial manner around the signal via.

20. The circuit board of claim 19 wherein the signal via, at least two of the first ground vias and at least two of the second ground vias are disposed co-linearly.

21. The connection system of claim 13 wherein the first set of ground vias includes multiple first ground vias which are substantially evenly distributed in a radial manner around the signal via, and wherein the second set of ground vias includes multiple second ground vias which are substantially evenly distributed in a radial manner around the signal via.

22. The circuit board of claim 21 wherein the signal via, at least two of the first ground vias and at least two of the second ground vias are disposed co-linearly.

* * * * *